United States Patent
Jin et al.

(10) Patent No.: US 9,578,766 B2
(45) Date of Patent: Feb. 21, 2017

(54) COVER OPENING DETECTION USING HALL SENSOR

(71) Applicant: Magnachip Semiconductor, Ltd., Cheongju-si (KR)

(72) Inventors: Hyung-nam Jin, Sejong-si (KR); Seung-hwan Park, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 19 days.

(21) Appl. No.: 14/325,859

(22) Filed: Jul. 8, 2014

(65) Prior Publication Data

US 2015/0097558 A1   Apr. 9, 2015

(30) Foreign Application Priority Data

Oct. 8, 2013   (KR) .................. 10-2013-0120137

(51) Int. Cl.
| | |
|---|---|
| *G01N 27/72* | (2006.01) |
| *H05K 5/03* | (2006.01) |
| *H04B 1/3888* | (2015.01) |
| *H04M 1/02* | (2006.01) |
| *H04M 1/18* | (2006.01) |

(52) U.S. Cl.
CPC .............. *H05K 5/03* (2013.01); *H04B 1/3888* (2013.01); *H04M 1/0245* (2013.01); *H04M 1/185* (2013.01); *H04M 2250/12* (2013.01); *Y10T 29/49117* (2015.01)

(58) Field of Classification Search
None
See application file for complete search history.

(56) References Cited

U.S. PATENT DOCUMENTS

| | | | |
|---|---|---|---|
| 6,701,166 B2 | 3/2004 | Lim | |
| 6,922,573 B2* | 7/2005 | Hijii | H04M 1/0214 324/207.2 |
| 7,028,410 B2* | 4/2006 | Sato | G01C 17/30 33/355 R |
| 7,746,201 B2* | 6/2010 | Huang | H04W 52/0254 335/205 |
| 2007/0298850 A1* | 12/2007 | Miyata | H04M 1/021 455/575.3 |
| 2014/0043259 A1* | 2/2014 | Park | G06F 3/0412 345/173 |
| 2014/0101578 A1* | 4/2014 | Kwak | G06F 3/017 715/761 |
| 2014/0298062 A1* | 10/2014 | Lee | H05K 5/03 713/323 |

FOREIGN PATENT DOCUMENTS

| | | |
|---|---|---|
| KR | 20-0167871 Y1 | 2/2000 |
| KR | 10-2005-0031754 A | 4/2005 |

OTHER PUBLICATIONS

Korean Office Action issued Apr. 21, 2015 in counterpart Application No. KR 10-2014-0129946 (6 pages, in Korean).

* cited by examiner

*Primary Examiner* — Minh N Tang

(57) ABSTRACT

A display terminal, an apparatus for cover opening detection, and a method of arranging a Hall sensor in a display terminal are provided. A display terminal includes a first body, and a Hall sensor disposed in the first body, the Hall sensor including a magnetic field sensing surface configured to sense a magnetic field, in which the magnetic field sensing surface is disposed at a slope with respect to an front surface of the first body.

19 Claims, 8 Drawing Sheets

COVER OPENING DETECTION USING HALL SENSOR

CROSS-REFERENCE TO RELATED APPLICATIONS

This application claims the benefit under 35 USC 119(a) of Korean Patent Application No. 10-2013-0120137 filed on Oct. 8, 2013, in the Korean Intellectual Property Office, the entire disclosure of which is incorporated herein by reference for all purposes.

BACKGROUND

1. Field

The following description relates to an arrangement of Hall sensor in a display terminal, an apparatus for cover opening detection, and a method of arranging a Hall sensor in a display terminal to avoid inaccurate sensing of the state of a flip cover without using a shielding sheet.

2. Description of Related Art

The Korean Utility Model Registration No. 20-0167871 relates to a device that detects whether a flip cover of a flip-type cordless phone is open or closed, and discusses a device including a magnetic sensor and a flip cover. The magnetic sensor detects a magnetic force at a PCB (Printed Circuit Board) and at a bottom of the PCB to control a power supply. The flip cover is integrally injected and inserts a magnet in a corresponding position of the magnetic sensor to be sensed by the magnetic sensor.

Such conventional technology uses a Hall sensor to detect whether the flip cover opens or closes but does not disclose a method to prevent inaccurate sensing when an angle of opening of the flip cover reach about 360 degrees and an arrangement method of a Hall sensor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a display terminal includes a first body and a Hall sensor disposed in the first body, the Hall sensor comprising a magnetic field sensing surface configured to sense a magnetic field, in which the magnetic field sensing surface is disposed at a slope with respect to an front surface of the first body.

An angle between the front surface of the first body and the magnetic field sensing surface may be between approximately 45 degrees and 135 degrees.

A surface of a chip comprising the Hall sensor may be disposed substantially perpendicular to the front surface of the first body.

The display terminal may further include a second body coupled to the first body, the second body being configured to substantially reach a back surface of the first body when the second body is opened.

The second body may include a magnet.

The Hall sensor may include at least one Hall element disposed on a semiconductor substrate.

The at least one Hall element may be configured to sense an N-pole or S-pole magnetic field direction generated by the magnet.

The at least one Hall element may be configured to sense a first magnetic field direction and a second magnetic field direction, a first magnetic field being sensed when the second body covers the front surface of the first body, and a second magnetic field being sensed when the second body reaches the rear side of the first body; and the first sensed magnetic field direction and the second sensed magnetic field direction may be opposite to each other.

The at least one Hall element may be configured to detect a magnetic field intensity generated by the magnet; and the display terminal may be configured to determine an angle of opening of the second body by using the sensed magnetic field direction and intensity.

The at least one Hall element may be laterally spaced apart from the magnet when the second body covers the front surface of the first body.

An angle between the magnetic field sensing surface and the first body may be between 35 to 55 degrees.

The magnetic field sensing surface of the Hall sensor may be substantially perpendicular to the front surface of the first body.

In another general aspect, an apparatus for cover opening detection includes a Hall sensor disposed in a first body, the Hall sensor configured to detect a magnetic field, and a magnet disposed in a second body, the first body and the second body being configured to be arranged substantially parallel to one another in an open state, and a magnetic field sensing surface of the Hall sensor and a plane corresponding to a magnetic equator of the magnet may be disposed at an acute angle or an obtuse angle in the open state.

Either the first body or the second body may include a display screen, and either the second body or the first body may include a cover configured to shield the display screen. The general aspect of the apparatus may further include a processor configured to determine whether the cover is open or closed based on a direction of a magnetic field generated by the magnet.

The Hall sensor may be disposed closer to a hinge that couples the first body and the second body than the magnet such that a first direction of the magnetic field that is detected when the cover is fully open is substantially opposite to a second direction of the magnetic field that is detected when the cover is completely closed.

In another general aspect, a method of arranging a Hall sensor in a display terminal involves disposing a Hall sensor in a first body, disposing a magnet in a second body, and producing a display terminal comprising a cover and a display screen by coupling the first body and the second body via a joint, in which the Hall sensor is disposed closer to the joint than the magnet in the display terminal.

The display terminal further may include a processor configured to determine whether the cover is in an open state or in a closed state based on a direction of a magnetic field detected by the Hall sensor.

The disposing of the Hall sensor may include positioning the Hall sensor in the first body such that a magnetic field sensing surface of the Hall sensor and a plane corresponding to a magnetic equator of the magnet form an acute angle or an obtuse angle in the open state or the closed state of the cover.

Other features and aspects will be apparent from the following detailed description, the drawings, and the claims.

Figure 1A:
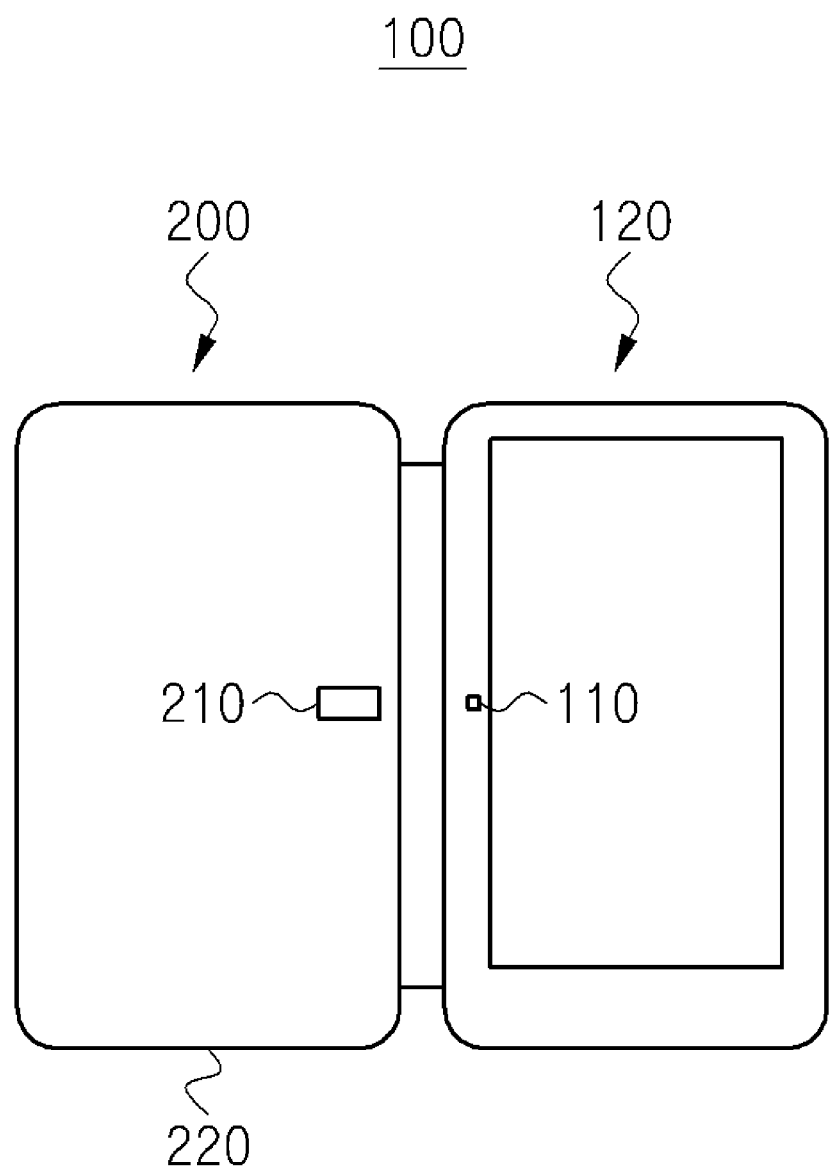
FIGS. 1A and 1B are diagrams illustrating a Hall sensor arrangement in an example of a display terminal that includes a flip cover.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms used in the present disclosure may be understood as follows.

While terms such as "first" and "second," etc., may be used to describe various components, such components must not be understood as being limited to the above terms. The above terms are used to distinguish one component from another. Structural differences between the components are not necessary. For example, a first component may be referred to as a second component, and likewise a second component may be referred to as a first component.

It will be understood that, when an element is referred to as being "connected to" another element, the element may be directly connected to the another element or intervening elements may be present therebetween. In contrast, when an element is referred to as being "directly connected to" another element, no intervening elements are present therebetween. In addition, unless explicitly described to the contrary, the word "comprise" and variations such as "comprises" or "comprising," will be understood to imply the inclusion of stated elements but not the exclusion of any other elements. Meanwhile, other expressions describing relationships between components such as "between", "immediately between" or "adjacent to" and "directly adjacent to" may be construed similarly.

Singular forms "a", "an" and "the" in the present disclosure are intended to include the plural forms as well, unless the context clearly indicates otherwise. It will be further understood that terms such as "including" or "having," etc., are intended to indicate the existence of the features, numbers, calculation s, actions, components, parts, or combinations thereof disclosed in the specification, and are not intended to preclude the possibility that one or more other features, numbers, calculation s, actions, components, parts, or combinations thereof may exist or may be added.

Unless otherwise defined, all terms used herein, including technical or scientific terms, have the same meanings as those generally understood by those with ordinary knowledge in the field of art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present application.

Figure 1B:
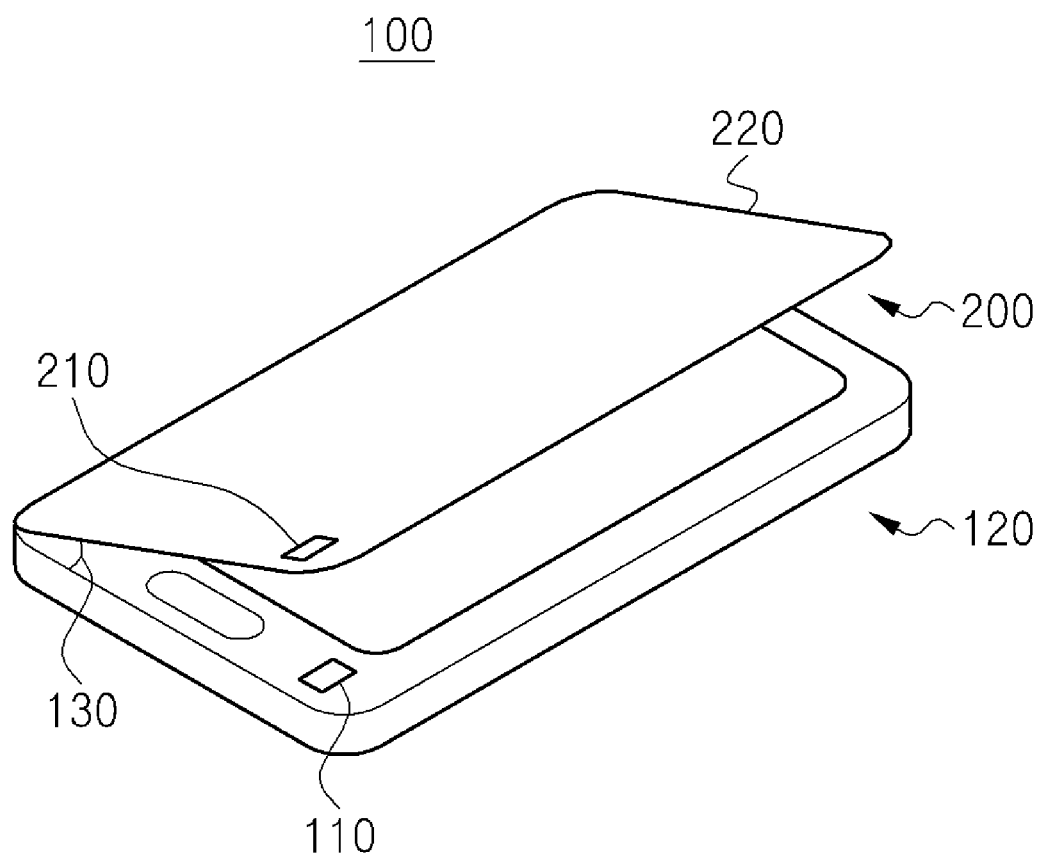

FIGS. 1A and 1B are diagrams illustrating the arrangement of a Hall sensor in an example of a display terminal that includes a flip cover.

Referring to FIG. 1A, a display terminal 100 includes a first body corresponding to a main body 120 and a second body corresponding to a flip cover 200 or a smart cover. A Hall sensor 110 is arranged in the main body 120. The flip cover 200 includes a magnet 210 and a covering unit 220. The main body 120 and the flip cover 200 of the display terminal 100 are illustrated as two separate bodies in this example. However, in another example, the main body 120 of the display terminal 100 and the flip cover 200 may integrally be implemented. That is, the flip cover 200 may be directly coupled to the display terminal 100 or to a back of a battery cover.

In this example, the display terminal 100 refers to a device including a display screen that performs a display function. The display terminal 100 may further include a processor that performs computations and a wireless or wired communication unit. For example, the display terminal 100 may correspond to a device for a wireless communication, such as a wireless mobile terminal. Examples of such a device include a cell phone, a smart phone, a tablet, a two-way radio and the like. The display terminal 100 includes the Hall sensor 100 and the main body 120.

The Hall sensor 110 or a sensor chip including the Hall sensor 110 senses the magnetic field being generated by the magnet 210 of the flip cover 200. The Hall sensor may include a plurality of Hall elements, a logic circuit and a memory.

The Hall sensor 110 may have a rectangular shape and may include at least one Hall element in the Hall sensor 110. The at least one Hall element may be symmetrically arranged at each corner to maintain a constant distance.

The at least one Hall element uses the Hall effect to measure the direction and intensity of a magnetic field. The Hall effect refers to the generation of a voltage difference, referred to as the Hall voltage, across an electrical conductor, in a direction transverse to an electric current in the conductor and a magnetic field perpendicular to the current. The Hall voltage is proportional to an amount of the electric current in the conductor and the magnetic field strength at a given location. Under a condition in which the amount of the electric current is constant, the change in Hall voltage is proportional to the change in magnetic field strength.

In one embodiment, the at least one Hall element may sense the magnetic field direction being generated by the magnet 210. For example, the at least one Hall element may determine whether the magnetic field being generated by the magnet 210 corresponds to an N-pole or S-pole.

The main body 120 may include a display device and a wireless transceiver for a wireless communication.

The flip cover 200 may correspond to a device for protecting a display screen and for providing slick appearance of a display terminal 100. The flip cover 200 may protect the display terminal 100 from a scratch or a damage that may result from an impact, such as an inadvertent dropping of the display terminal 100. The flip cover 200 may include the magnet 210 generating a magnetic field and the covering unit 220 that covers a front of the display terminal 100. The act of opening or closing of the flip cover 200 may generate a variation in the magnetic field around the magnet 210, and the variation of the magnetic field may be sensed by the Hall sensor 110 of the display terminal 100.

The magnet 210 may generate the magnetic field around the Hall sensor 110. The magnet 210 is attached with the covering unit 220 to move according to a movement of the covering unit 220 and the magnetic field of around the Hall sensor 110 is changed according to the movement of the covering unit 220.

The covering unit 220 may protect the front surface of the display terminal 100, and may internally or an externally include the magnet 210. For instance, the magnet may be embedded or positioned inside a plastic material that forms the covering unit 220.

As illustrated in FIG. 1B, the covering unit 220 may be opened or closed according to a user's usage. In the event that the covering unit 220 is completely covering the display terminal 100, an angle of opening 130 may be considered to be at a 0 degree. In the event that the display terminal 100 reaches a back of the display terminal 100, the angle of opening 130 may be about 100 to 360 degrees. In this example, the covering unit 220 may be placed in the back side of the main body 130, and the angle of opening 130 is approximately 360 degrees.

A distance between the Hall sensor 110 and the magnet 210 in a case in which the angle of opening 130 is about 0 degree is substantially the same with the distance in a case in which the angle of opening 130 is about 360 degrees. This may cause the Hall sensor 110 to inaccurately sense a state of the covering unit 220, such as whether the covering unit 220 is in an open state or in a closed state. That is, although the angle of opening of the flip cover 200 is about 0 degree, the Hall sensor 110 may sense the angle of opening 130 thereof is about 360 degrees, leading to an incorrect conclusion that the covering unit 220 is in an open state when it is actually in a closed state. In order to prevent this situation, a mechanism is necessary to allow the Hall sensor 110 to discriminate between the two angles of opening 130 of the covering unit 220. That is, when the angle of opening of the flip cover 200 is about 360 degrees, a mechanism is necessary for the Hall sensor 110 to sense that the covering unit 220 is an open state and not a closed state.

Figure 2A:
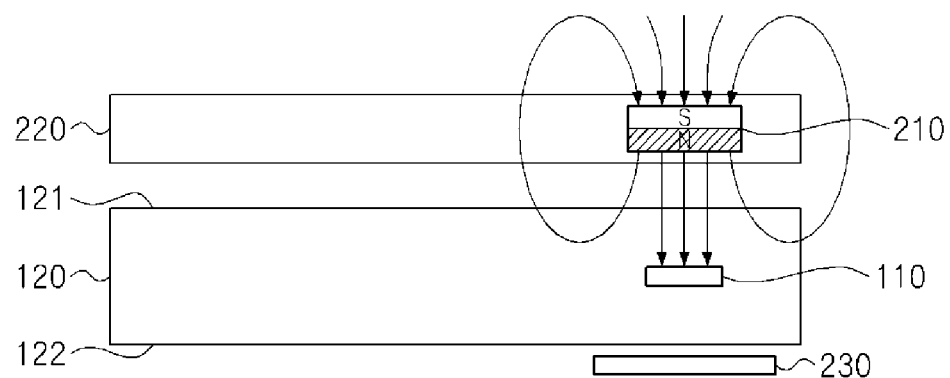
FIGS. 2A and 2B are diagrams illustrating an example of a method of sensing flip cover using a shielding sheet.
Figure 2B:
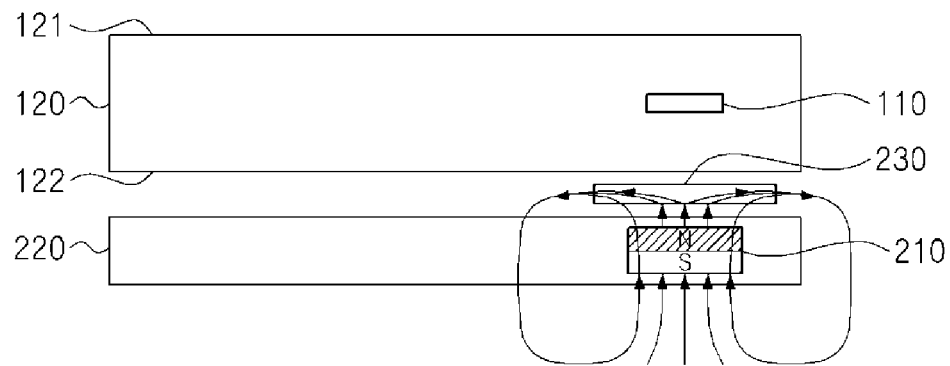

FIGS. 2A and 2B are diagrams illustrating an example of a method of sensing a flip cover using a shielding sheet.

FIG. 2A illustrates an example of a display terminal 100 that is in a state in which the angle of opening 130 of the flip cover 200 is about 0 degree. That is, the flip cover 200 is closed and arranged in a vicinity of the front side of the main body 120 of the display terminal 121 having a display screen. When the angle of opening of the flip cover 200 is 0 degree, the magnet 210 and the Hall sensor 110 may be disposed in a close proximity to each other, and the Hall sensor 110 may sense an intense magnetic field generated by the magnet 210. In response to the Hall sensor 110 sensing an intense magnetic field, it may be determined that the flip cover 200 is in a closed state.

FIG. 2B illustrates a state in which the angle of opening 130 of the flip cover 200 is about 360 degrees. That is, the flip cover 200 reaches a back side of the display terminal 122. In the event that the angle of opening 130 of the flip cover 200 is about 360 degrees, the magnet 210 and the Hall sensor 110 may be close to each other. In the event that the angle of opening 130 of the flip cover 200 is about 360 degrees, the magnetic field from the magnet 210 may be blocked from reaching the Hall sensor 110 in strong intensity by using a shielding sheet 230.

In this example, the shielding sheet 230 is equipped at a back side of the main body 120 in the display terminal 100. The shielding sheet 230 may include a metallic material that blocks a magnetic field flow. In the event that the angle of opening 130 of the flip cover 200 is about 360 degrees, the shielding sheet 230 may block the magnetic field generated by the magnet 210 so that the Hall sensor 110 may not sense the magnetic field with strong intensity. Whether the magnetic field is sufficiently strong may be determined based on a predetermined threshold value, for example. When the Hall sensor 110 does not sense the magnetic field due to the shielding sheet 230, the display terminal 100 may continually determine that the flip cover 200 is in an open state.

The process of sensing the flip cover 200 using the shielding sheet 230 additionally requires the use of a shielding sheet 230; further, the process may inaccurately result in sensing an open operation of the flip cover 200 according to a position of the shielding sheet 230. Furthermore, a production of the display terminal 100 may require a procedure of adding the shielding sheet 230 to increase a production cost.

Further, while the shielding sheet 230 is placed in the back side of the main body 120 in the example illustrated in FIGS. 2A and 2B, the shielding sheet 230 may be disposed at any location suitable for blocking the magnetic field from the covering unit 220 in an open state or in a closed state, as long as the arrangement allow the Hall sensor 110 to discriminate between an open state and a closed state of the covering unit 220. For example, the shielding sheet 230 may be placed right under the Hall sensor, inside or outside of the main body 120, or on an upper or lower surface of the covering unit 220, whether inside or outside of the material that forms the covering unit 220.

Figure 3:
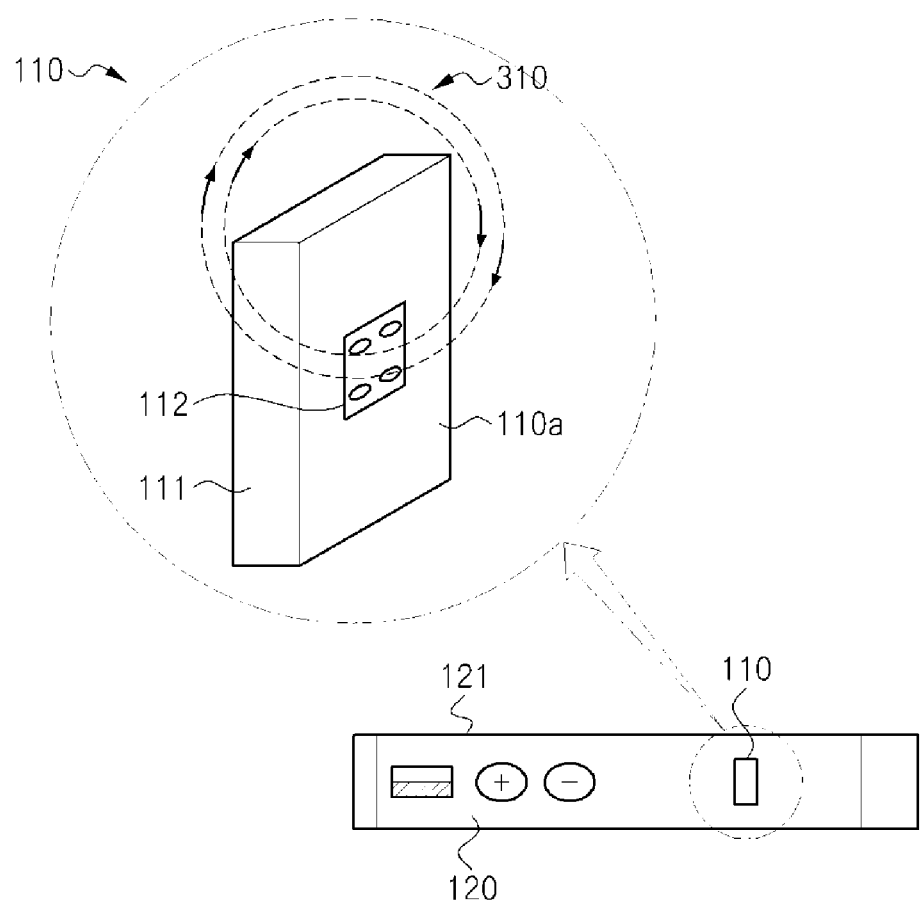
FIG. 3 is a diagram illustrating a vertical arrangement of a Hall sensor in another example of a display terminal.

FIG. 3 is a diagram illustrating a vertical arrangement of a Hall sensor in an example of a display terminal.

The Hall sensor 110 may be vertically or slopingly arranged with respect to the magnetic field sensing surface 110a and a surface of the display terminal. The surface may be a front surface 121 or a back surface 122 of the main body of the display terminal.

As illustrated in the FIG. 3, the Hall sensor 110 includes the at least one Hall element 112 formed on a semiconductor substrate 111. The at least one Hall element 112 may include a p-type well region on the semiconductor substrate 111 and an n-type high doping ion implantation region formed on the p-type well region.

That is, the at least one Hall element 112 is formed on the surface of the semiconductor substrate 111 and is produced in parallel with the surface of the semiconductor substrate 111. The Hall sensor 110 being formed by the Hall element 112 is packaged to be equipped at a PCB (Printed Circuit Board) of the display terminal 100 as a semiconductor chip type. Therefore, the Hall sensor 110 may be vertically installed or installed to form a slope at the front or the back of the display terminal 121 or 122 in the packaged chip. Thus, the magnetic field sensing surface 110a may be perpendicularly arranged or arranged at a slope with respect to the surface of the display terminal 121 or 122. Herein, a slope refers to an arrangement in which the main surface of the display terminal 121 or 122 and the magnetic field sensing surface 110a forms an acute angle or an obtuse angle. In another example, the main surface of the display terminal 121 or 122 and the magnetic field sensing surface 110a may form angle that measures between 10 to 80 degrees or between 100 to 170 degrees.

A chip including the at least one Hall element 112 may form a rectangular shape that may be defined by a width (X axis), a length (Y axis) and a height (Z axis). Assuming that each of values of the width and the length are far longer than a value of the height, the surface of the chip defined by the width and the length and the surface of the display terminal 121 or 122 facing a surface of the covering unit 220 are vertically arranged.

The vertical arrangement in the above indicates that the Hall sensor 110 is not horizontally arranged with the surface of the display terminal 121 or 122. The Hall sensor 110 may be arranged so that the Hall sensor 110 and the surface of the display terminal 121 or 122 may form an angle, such as 45 degrees or 90 degrees, for example.

Figure 4A:
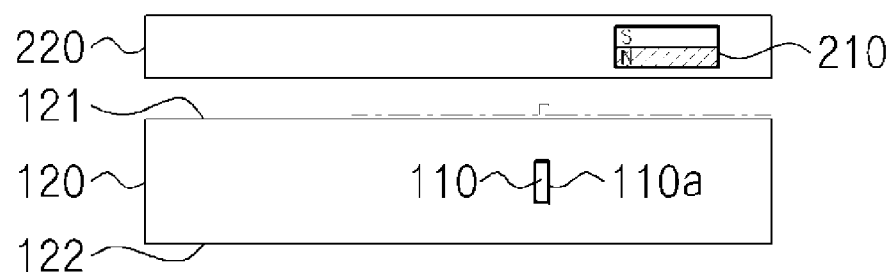
FIGS. 4A and 4B are diagrams illustrating a vertical arrangement of a Hall sensor in another example of a display terminal.
Figure 4B:
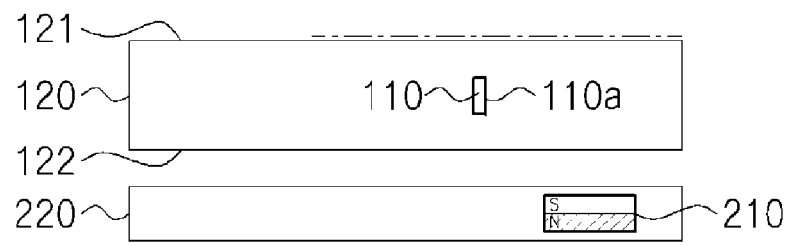

FIGS. 4A and 4B are diagrams illustrating a vertical arrangement of the Hall sensor with respect to a surface of an example of a display terminal.

When the magnetic field sensing surface 110a is inclined to the surface of the display terminal 121 or 122, although a magnet position is changed in the flip cover 200, the Hall sensor 110 may sense the magnetic field direction and intensity through the at least one Hall element 112 regardless of the change.

The FIGS. 4A and 4B illustrate an example in which the magnetic field sensing surface 110a and the surface of the display terminal 121 or 122 are perpendicular to each other, or form an angle of approximately 90 degrees. When the magnetic field sensing surface 110a and the surface of the display terminal 121 or 122 is arranged perpendicular to each other, the Hall sensor 110 may use only the magnetic field direction sensed by the at least one Hall element 112 to determine whether the angle of opening 130 of the flip cover 200 is 0 degree or 360 degrees.

FIG. 4A describes an example of a display terminal in which the angle of opening 130 is 0 degree, and FIG. 4B describes the example of the display terminal of FIG. 4A in which the angle of opening 130 is 360 degrees. In the event that the covering unit 220 is completely closed or completely opened, the magnetic field intensity sensed by the Hall sensor 100 is substantially same because the shielding sheet 230 is not used in this example. However, the magnetic field directions sensed by the Hall sensor 110 may be in opposite directions. That is, although the magnetic field intensity is substantially same, the magnetic field directions sensed by the Hall sensor 110 are opposite and allows the display terminal to discriminate whether the angle of opening 130 of the flip cover 200 is 0 degree or 360 degrees. For example, provided that a clockwise direction of the magnetic field is designated as (+), and an anticlockwise direction of the magnetic field is designated as (−), the Hall sensor 110 may sense a (+)magnetic field when the covering unit 220 covers the front side of the display terminal 121, and the Hall sensor 110 may sense a (−)magnetic field when the covering unit 220 reaches the back side of the display terminal 122. A mechanism for sensing a direction of the magnetic field will be described in reference to FIGS. 5A and 5B.

Figure 5A:
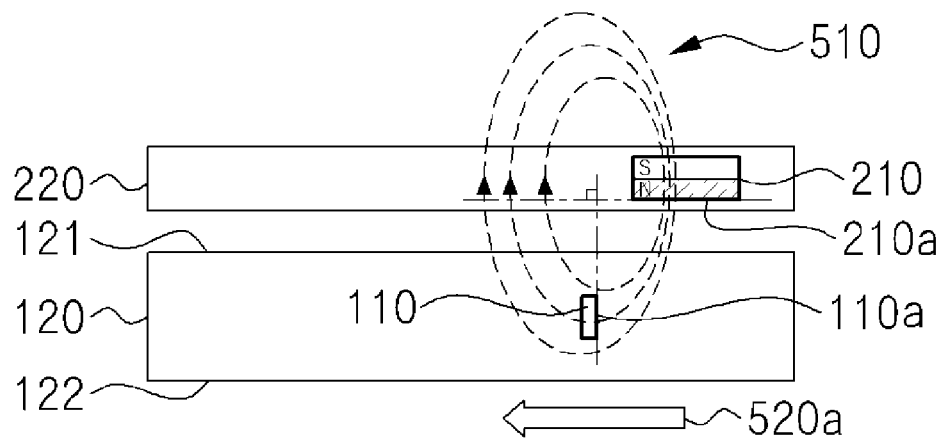
FIGS. 5A and 5B are diagrams illustrating the sensed direction of a magnetic field in another example of a display terminal having a vertical arrangement of the Hall sensor.
Figure 5B:
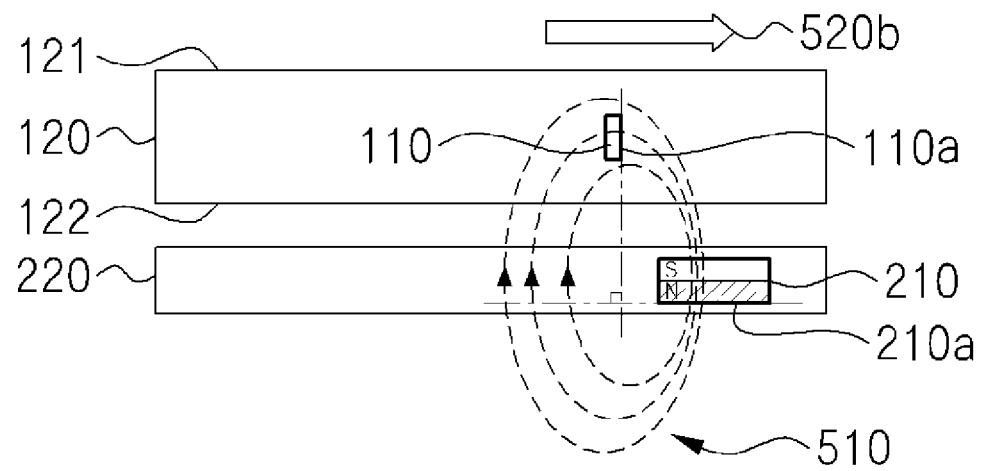

FIGS. 5A and 5B are diagrams illustrating an example of a method of sensing the directionality of the magnetic field according to an example of a display terminal having a vertical arrangement of a Hall sensor.

As illustrated in FIGS. 5A and 5B, in this example, the magnet 210 in the covering unit 220 forms an N-pole and S-pole to generate a magnetic field force line 510 from an N-pole to an S-pole. The magnetic force line may pass the Hall sensor 110 to sense the magnetic field direction.

FIG. 5A describes an example in which the angle of opening 130 of the flip cover 200 is 0 degree, and an angle between the magnetic field sensing surface 110a that is provided vertically and the magnetic field generation surface 210a in the covering unit 220 are perpendicular (i.e., form an angle of 90 degrees). In FIG. 5A, when the magnetic field generation surface 210 corresponds to an N-pole, the N-pole magnetic field direction 520a sensed through the at least one Hall element 112 in the Hall sensor 110 is formed from right to left (i.e., a first magnetic field direction).

FIG. 5B describes an example in which the angle of opening 130 of the flip cover 200 is 360 degrees, and the magnetic field sensing surface 110a and the magnetic field generation surface 210a are perpendicular to each other or form an angle of 90 degrees. In FIG. 5B, when the magnetic field generation surface corresponds to an N-pole, the N-pole magnetic field direction 520a sensed through the at least one Hall element 112 in the Hall sensor 110 is formed from left to right (i.e., a second magnetic field direction).

Referring to FIG. 5A and FIG. 5B, the first magnetic field direction 520a and the second magnetic field 520b are in two opposite directions. Therefore, when the at least one Hall element 112 senses the first magnetic field direction 520a, the display terminal 100 may determine that the flip cover 200 is in a close state (i.e., an angle of opening of 0 degree). When the at least one Hall element 112 senses the second magnetic field direction, the flip cover 200 may determine that the flip cover 200 is in an open state (i.e., an angle of opening of 360 degrees).

The Hall sensor 110 may be closely arranged toward the hinge in comparison to an area corresponding to the magnet 210 in main body 120. That is, in a state in which the flip cover 200 is covering the display terminal 100 (an angle of opening of 0 degree), the vertically arranged Hall sensor 110 may be not overlapped with the magnet 210. In the alternative, the Hall sensor 110 may be arranged further away from the hinge than the magnet 210. The position of the Hall sensor 110 may be vertically arranged with the magnet 210 and may be arranged so as to not to overlap with the magnet 210, in order to increase a sensing efficiency for the magnetic field direction and intensity generated by the magnet 210.

When the position of the Hall sensor 110 is overlapped with the magnet 210, the direction of the magnetic field force line being generated by the magnet 210 may substantially horizontally pass the surface of the Hall sensor 110. In this case, the magnetic field intensity may be very weak and generate a situation in which the angle of opening 130 of the flip cover 200 may not be accurately sensed. Therefore, in order to ensure that a vertical direction of the magnetic field force line may pass the surface of the hall sensor 110, the hall sensor 110 may be arranged so as to not to overlap with the magnet 210.

As a similar procedure, when the flip cover 200 reaches the back of the main body 120, the Hall sensor 110 may be arranged closer to the hinge area with respect to an area corresponding to the magnet 210. That is, when the flip cover 200 is reached on the back of the main body 120, the vertically arranged Hall sensor 110 may not overlap with the magnet 210 in the vertical direction. The position of the Hall sensor 110 being vertically arranged with the magnet 210 is not overlapped to increase a sensing efficiency for the magnetic field direction and intensity generated by the magnet 210.

Figure 6A:
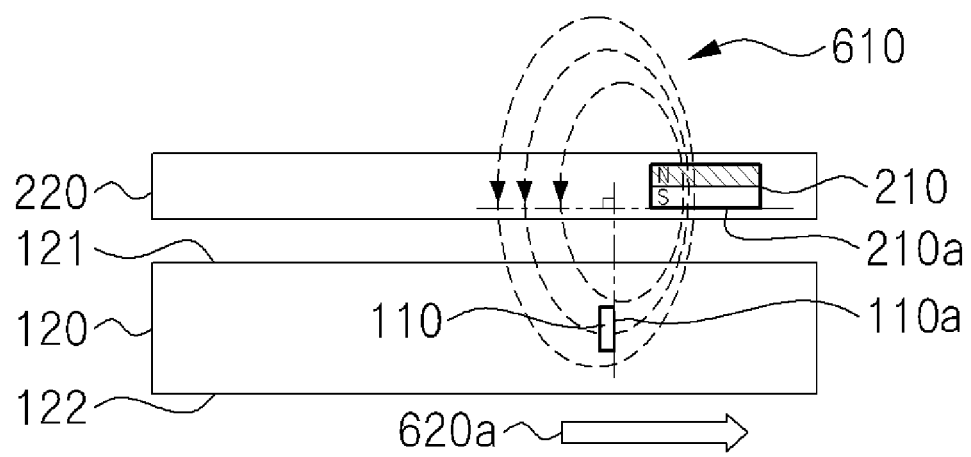
FIGS. 6A and 6B are diagrams illustrating the sensed direction of a magnetic field in yet another example of a display terminal based on a difference in the arrangement of magnetic pole.
Figure 6B:
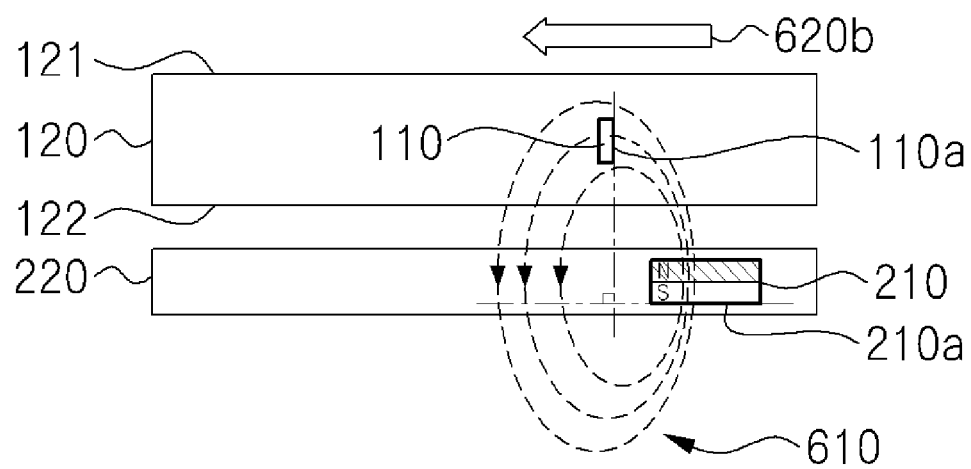

FIGS. 6A and 6B are diagrams illustrating a sensing direction of the magnetic field according to a change of a magnetic pole.

FIG. 6A illustrates an example in which the magnetic field sensing surface 110a is closely arranged with the S-pole of the magnet 210. As illustrated in FIG. 5A, a magnetic field force line 610 is generated from the N-pole to the S-pole. The magnetic field force line 610 may pass the Hall sensor 110 to sense the magnetic field direction. The magnetic field direction in the S-pole of the magnet 210 corresponds to an inflowing direction to the magnet 210 and the Hall sensor 110 may sense the angle of opening 130 of the flip cover 200 when not the N-pole but the S-pole of the magnet 210 is used.

Further, in the example illustrated in FIG. 6A, the angle of opening 130 of the flip cover 200 is about 0 degree, and the angle between the magnetic field sensing surface 110a and the magnetic field generation surface 210a is perpendicular, forming approximately a 90-degree angle. As illustrated in FIG. 6A, when the magnetic field generation surface 210a corresponds to the S-pole, S-pole magnetic field direction sensed through the at least one Hall element 112 in the Hall sensor 110 is formed from the left to right (i.e., the first magnetic field direction).

FIG. 6B illustrates an example in which the angle of opening 130 of the flip cover 200 is about 360 degrees, and the angle between the magnetic field sensing surface 110a and the magnetic field generation surface 210a is approximately 90 degrees. As illustrated in FIG. 6B, the S-pole magnetic field direction recognized inside the Hall element in the Hall sensor 110 is formed from the right direction to the left direction when the magnetic field generation surface 210a is S-pole (the first magnetic field direction).

In FIGS. 6A and 6B, the first magnetic field direction 620a and the second magnetic field direction 620b form two opposite directions. Therefore, the display terminal 100 may sense the close state of the flip cover 200 when the at least one Hall element senses the first magnetic field direction (i.e., 0 degree). The flip cover 200 may sense the open state of the flip cover 200 when the Hall element senses the second magnetic field direction (i.e., 360 degrees).

As illustrated in FIGS. 5A, 5B, 6A and 6B, the Hall sensor 110 may determine whether the N-pole of the magnet 210 is arranged in a front or back of the display terminal 100 to sense the direction of the magnetic field force line. This is possible a case where the Hall sensor 110 is vertically arranged to the surface of the display terminal 121 or 122.

Figure 7A:
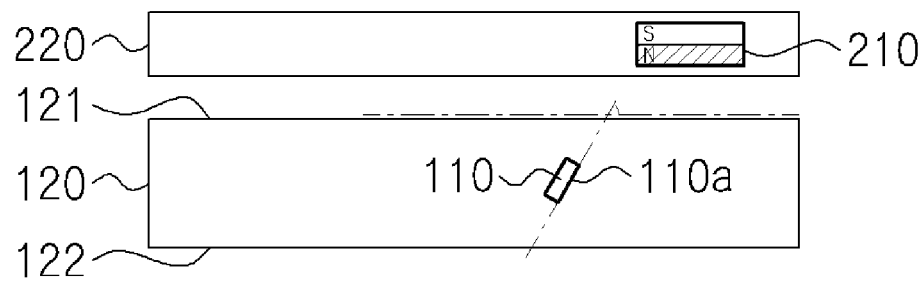
FIGS. 7A and 7B are diagrams illustrating an example of a method of sensing the flip cover in a display device having a sloped arrangement of the Hall sensor.
Figure 7B:
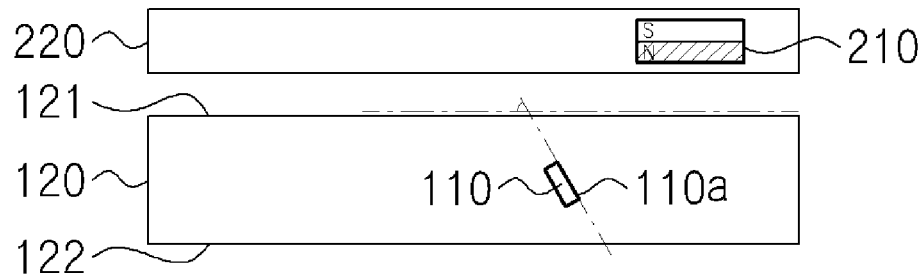

FIGS. 7A and 7B are diagrams illustrating an example of a method of sensing the flip cover that uses a sloped arrangement of the Hall sensor.

FIG. 7A illustrates an example in which an angle between the magnetic field sensing surface 110a and the surface of the display terminal 121 or 122 is less than 90 degrees. On the other hands, FIG. 7B illustrates an example in which the angle between the magnetic field sensing surface 110a and the surface of the display terminal 121 or 122 exceeds 90 degrees.

As illustrated, when the magnetic field sensing surface 110a and the surface of the display terminal 121 or 122 are arranged to form a slope between 45 degrees and 135 degrees, the magnetic field direction and intensity sensed through the at least one Hall element 112 may be different throughout 0 degree through 360 degrees of angle of opening 130. The magnetic field intensity sensed through the at least one Hall element may be different as a constant rate according to a corresponding slope.

The magnetic field direction or intensity sensed through the at least one Hall element 112 may be used for determining the angle of opening 130 of the flip cover 200 (e.g., 0 degree or 360 degrees). The magnetic field direction or intensity sensed through the at least one Hall element 112 may be used for data calculating the angle of opening 130 of the flip cover 200.

In FIGS. 7A and 7B, the Hall sensor 110 may be formed so that the magnetic field sensing surface 110a and the magnetic field generation surface 210a in the magnet 210 form an inclined angle that is neither parallel nor perpendicular. That is, the Hall sensor 110 is not horizontally arranged with the magnet 210. For example, the smallest angle between the two surfaces may be between 10 to 80 degrees, 100 to 150 degrees, and the like. On the other hand, two lines at an angle of approximately 0 degree, 180 degrees or 360 degrees are considered parallel to each other. Angles that are within approximately 5 degrees or under or within 5 degrees from 360 degrees may be considered as being substantially parallel. Likewise, an angle that measures approximately 85 to 95 degrees may be considered as being substantially perpendicular.

When the magnetic field sensing surface 110a and the magnetic field generation surface 210a are inclined in 0 degree through 360 degrees of the angle of opening 130, the magnetic field direction or intensity sensed through the at least one Hall element may be different. The magnetic field intensity sensed through the at least one Hall element 112 may be different as the constant rate according to a corresponding slope.

The magnetic field direction or intensity sensed through the at least one Hall element 112 may be used for determining the angle of opening 130 of the flip cover 200 (e.g., 0 degree or 360 degrees). The magnetic field direction or intensity sensed through the at least one Hall element 112 may be used for data calculating the angle of opening 130 of the flip cover 200.

For example, when an angle between the magnetic field sensing surface 110a and the magnetic field generation surface 210a is about 45 degrees, the magnetic field direction and intensity sensed through the at least one Hall element may be measured as (N-pole, 80 mT). On the other hand, when the angle of opening 130 of the flip cover 200 is about 350 degrees, the magnetic field direction and intensity sensed through the at least one Hall element may be measured as (S-pole, 20 mT). The display terminal 100 may determine the angle of opening 130 of the flip cover 200 as about 10 degree or 350 degrees based on a reference table. The reference table for a tolerance of the magnetic field direction and intensity being predetermined according to the angle of opening 130 of the flip cover 200.

Provided above are various examples of arrangements of Hall sensors in display terminals that may lower a possibility of inaccurately sensing the angle of opening of a flip cover that reaches 360 degrees. The examples provide a method to detect the magnetic field generated by a magnet of the flip cover without a different shielding sheet to sense opening and closing of a flip cover. The examples propose a Hall sensor arrangement in a display terminal that is configured to sense an open operation of the flip cover based on a sensing result of the magnetic field through a Hall element in a Hall sensor. In some examples, Hall sensor arrangement in a display terminal includes a first body and a Hall sensor including a magnetic field sensing surface configured to sense a magnetic field, the Hall sensor being arranged in the first body. The magnetic field sensing surface and a first body surface may form a slope.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra-mobile personal computer (UMPC), a portable lab-top PC, a global positioning system (GPS) navigation, and devices such as a high definition television (HDTV), an optical disc player, a DVD player, a Blue-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DISCRIPTION OF SYMBOLS

100: DISPLAY TERMINAL
110: HALL SENSOR OR SENSOR CHIP
110a: MAGNETIC FIELD SENSING SURFACE
112: AT LEAST ONE HALL ELEMENT
120: MAIN BODY
121: FRONT OF DISPLAY TERMINAL
122: BACK OF DISPLAY TERMINAL
130: ANGLE OF OPENING
200: FLIP COVER
210: MAGNET 210a: MAGNETIC FIELD GENERATION SURFACE
220: COVERING UNIT
230: SHIELDING SHEET
510: N-POLE MAGNETIC FIELD FORCE LINE
520a: N-POLE MAGNETIC FIELD DIRECTION
610: S-POLE MAGNETIC FIELD FORCELINE
620a: S-POLE MAGNETIC FIELD DIRECTION

What is claimed is:
1. A display terminal comprising:
a first body having a front surface and a back surface;
a second body coupled to the first body via a joint, the second body being configured to substantially reach the back surface of the first body when the second body is opened; and, a Hall sensor disposed in the first body, the Hall sensor comprising a magnetic field sensing surface and being configured to directly sense a magnetic field generated by a magnet disposed in the second body, wherein the magnetic field substantially vertically passes the magnetic field sensing surface of the Hall sensor;

wherein the magnetic field sensing surface is disposed at a slope with respect to the front surface of the first body;

wherein an angle of opening between the second body and the front surface of the first body ranges between approximately 0 degree and approximately 360 degrees;

wherein the Hall sensor comprises a Hall element disposed on a semiconductor substrate;

wherein the Hall element is configured to sense a first magnetic field in response to the second body covering the front surface of the first body, and a second magnetic field in response to the second body reaching the back surface of the first body; and wherein a direction of the first sensed magnetic field is substantially opposite to a direction of the second sensed magnetic field.

2. The display terminal of claim 1, wherein an angle between the front surface of the first body and the magnetic field sensing surface is between approximately 45 degrees and 135 degrees.

3. The display terminal of claim 1, wherein a surface of a chip comprising the Hall sensor is disposed substantially perpendicular to the front surface of the first body.

4. The display terminal of claim 1, wherein the Hall element is configured to sense an N-pole or S-pole magnetic field direction generated by the magnet.

5. The display terminal of claim 4, wherein the Hall element is configured to detect a magnetic field intensity generated by the magnet; and the display terminal determines an angle of opening of the second body by using the sensed magnetic field direction and intensity.

6. The display terminal of claim 1, wherein the Hall element is laterally spaced apart from the magnet in response to the second body covering the front surface of the first body.

7. The display terminal of claim 1, wherein an angle between the magnetic field sensing surface and the front surface of the first body is between 35 to 55 degrees.

8. The display terminal of claim 1, wherein the magnetic field sensing surface of the Hall sensor is substantially perpendicular to the front surface of the first body.

9. The display terminal of claim 1, wherein the Hall element comprises a first well region having a first conductivity type on the semiconductor substrate and a second doping region having a second conductivity type opposite to the first conductivity type formed on the first well region.

10. The display terminal of claim 1, wherein the Hall element forms a rectangular shape defined by a width, a length and a height, each value of the width and the length being greater than a value of the height.

11. An apparatus for cover opening detection comprising:
a Hall sensor disposed in a first body having a front surface and a back surface;
a magnet disposed in a second body and generated a magnetic field, the first body and the second body being configured to be arranged substantially parallel to one another in an open state; and
a processor configured to determine whether the cover is open or closed based on a direction of the magnetic field, wherein a magnetic field sensing surface of the Hall sensor and a plane corresponding to a magnetic equator of the magnet are disposed at an acute angle or an obtuse angle in the open state;

wherein the Hall sensor is configured to directly detect the magnetic field generated by the magnet disposed in the second body and the magnetic field substantially vertically passes the magnetic field sensing surface of the Hall sensor;

wherein an angle of opening between the second body and the front surface of the first body ranges between approximately 0 degree and approximately 360 degrees; and, wherein a first direction of the magnetic field that is detected in response to the cover being fully opened is substantially opposite top a second direction of the magnetic field that is detected in response to the cover being completely closed.

12. The apparatus of claim 11, wherein either the first body or the second body comprises a display screen, and either the second body or the first body comprises a cover configured to shield the display screen.

13. The apparatus of claim 12, wherein the Hall sensor is disposed closer to a hinge that couples the first body and the second body than the magnet.

14. The apparatus of claim 11,
wherein the Hall sensor comprises a Hall element disposed on a semiconductor substrate; and
wherein the Hall element comprises a first well region having a first conductivity type on the semiconductor substrate and a second doping region having a second conductivity type opposite to the first conductivity type formed on the first well region.

15. The apparatus of claim 11, wherein the Hall sensor comprises a Hall element disposed on a semiconductor substrate; and
wherein the Hall element forms a rectangular shape defined by a width, a length and a height, each value of the width and the length being greater than a value of the height.

16. A method of arranging a Hall sensor in a display terminal, the method comprising:
disposing a Hall sensor in a first body having a front surface and a back surface, the Hall sensor comprising a Hall element disposed on a semiconductor substrate;
disposing a magnet in a second body; and
producing a display terminal comprising a cover and a display screen by coupling the first body and the second body via a joint,
wherein the Hall sensor is disposed closer to the joint than the magnet in the display terminal;
wherein the Hall sensor is configured to directly detect a magnetic field generated by the magnet disposed in the second body and the magnetic field substantially vertically passes a magnetic field sensing surface of the Hall sensor;
wherein an angle of opening between the second body and the front surface of the first body ranges between approximately 0 degree and approximately 360 degrees;
wherein the display terminal further comprises a processor configured to determine whether the cover is in an open state or in a closed state based on a direction of the magnetic field; and, wherein a first direction of the magnetic field that is detected by the Hall sensor in response to the cover being fully open is substantially opposite to a second direction of the magnetic field that is detected by the Hall sensor in response to the cover being completely closed.

17. The method of claim 16, wherein the disposing of the Hall sensor comprises positioning the Hall sensor in the first body such that the magnetic field sensing surface of the Hall sensor and a plane corresponding to a magnetic equator of the magnet form an acute angle or an obtuse angle in the open state or the closed state of the cover.

18. The method of claim 16, wherein the Hall element comprises a first well region having a first conductivity type on the semiconductor substrate and a second doping region having a second conductivity type opposite to the first conductivity type formed on the first well region.

19. The method of claim 16, wherein the Hall element forms a rectangular shape defined by a width, a length and a height, each value of the width and the length being greater than a value of the height.

\* \* \* \* \*